US007385413B2

(12) United States Patent
Miyagawa et al.

(10) Patent No.: US 7,385,413 B2
(45) Date of Patent: Jun. 10, 2008

(54) ELECTRICAL INSPECTION METHOD AND METHOD OF FABRICATING SEMICONDUCTOR DISPLAY DEVICES

(75) Inventors: Keisuke Miyagawa, Kanagawa (JP); Mitsuaki Osame, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/588,364

(22) Filed: Oct. 27, 2006

(65) Prior Publication Data

US 2007/0040572 A1 Feb. 22, 2007

Related U.S. Application Data

(62) Division of application No. 11/043,995, filed on Jan. 28, 2005, now Pat. No. 7,129,736, which is a division of application No. 10/625,469, filed on Jul. 23, 2003, now Pat. No. 6,864,703.

(30) Foreign Application Priority Data

Jul. 26, 2002 (JP) ............................ 2002-218705

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS

| | | | | |
|---|---|---|---|---|
| 5,377,030 | A | 12/1994 | Suzuki et al. | |
| 5,506,516 | A | 4/1996 | Yamashita et al. | |
| 5,619,262 | A | 4/1997 | Uno | |
| 5,686,936 | A | 11/1997 | Maekawa et al. | |
| 5,831,675 | A | 11/1998 | Ueno | |
| 6,014,035 | A | 1/2000 | Taniguchi | |
| 6,275,061 | B1 * | 8/2001 | Tomita | 324/770 |
| 6,762,735 | B2 * | 7/2004 | Koyama | 345/76 |
| 6,864,703 | B2 | 3/2005 | Miyagawa et al. | |
| 2004/0239598 | A1 | 12/2004 | Koyama | |

FOREIGN PATENT DOCUMENTS

| | | |
|---|---|---|
| EP | 0 678 848 A1 | 10/1995 |
| JP | 05-005866 | 1/1993 |
| JP | 05-165433 | 7/1993 |

(Continued)

*Primary Examiner*—Ha Tran Nguyen
*Assistant Examiner*—Trung Q. Nguyen
(74) *Attorney, Agent, or Firm*—Nixon Peabody LLP; Jeffrey L. Costellia

(57) ABSTRACT

A method of electrically inspecting semiconductor display devices, which is capable of inspecting whether a signal is normally input to the pixels and whether an electric charge is normally held by the holding capacitors without using the video signal line as a passage for reading the electric charge and without separately providing an inspection-dedicated circuit.

Power source lines which are used as passages for supplying the power source voltage are used as passages for reading the electric charge. Namely, the power source lines that can be connected to the signal lines are used as passages for inputting an inspection signal to the holding capacitors in the pixels and for reading the electric charge from the holding capacitors in the pixels.

13 Claims, 14 Drawing Sheets

FOREIGN PATENT DOCUMENTS

| | | | |
|---|---|---|---|
| JP | 06-043490 | | 2/1994 |
| JP | 07-295520 | | 11/1995 |
| JP | 09-015645 | | 1/1997 |
| JP | 2792634 | B2 | 9/1998 |
| JP | 11-038374 | | 2/1999 |
| JP | 3122866 | B2 | 1/2001 |
| JP | 3203864 | B2 | 8/2001 |
| JP | 2002-032035 | | 1/2002 |
| JP | 3250520 | B2 | 1/2002 |

* cited by examiner

ELECTRICAL INSPECTION METHOD AND METHOD OF FABRICATING SEMICONDUCTOR DISPLAY DEVICES

BACKGROUND OF THE INVENTION

1. Field of the Invention

This invention relates to an electrical inspection method (hereinafter simply called inspection method) for the pixel unit, that is conducted in the step of fabricating an active matrix semiconductor display device or after the completion of the active matrix semiconductor display device. More specifically, the invention relates to a method of fabricating semiconductor display devices by employing the above inspection method.

2. Description of the Related Art

In recent years, attention has been given to technology for fabricating thin-film transistors (TFTs) by using a semiconductor film of a thickness of about several to about several hundreds of nanometers formed on the surface of an insulating material to meet an increasing demand for the active matrix semiconductor display devices using TFTs as switching elements. Representative examples of the active matrix semiconductor display device may include liquid crystal display devices, light-emitting devices and DMDs (digital micromirror devices).

The active matrix semiconductor display device includes switching elements that are arranged in the pixels corresponding to several hundreds of thousand to several millions of regions divided like a matrix. The switching elements control the input of voltage or current to the semiconductor elements arranged in the pixels. Hereinafter, the voltage stands for a potential difference from a particular fixed potential unless stated otherwise.

There has recently been realized a so-called system-on-panel technology according to which drive circuits such as scanning line drive circuits for selecting the pixels and signal line drive circuits for inputting video signals to the selected pixels, are integrally formed on the same substrate of the pixel unit on where the pixels have been arranged. The system-on-panel makes it possible to greatly decrease the number of connection terminals and, hence, to decrease space for arranging the connection terminals and to increase the yield while suppressing the occurrence of defective connection.

The active matrix semiconductor display device (hereinafter simply referred to as semiconductor display device) is completed through a variety of fabrication steps. For example, a liquid crystal display device is fabricated chiefly through a step of forming a semiconductor film and forming a pattern, a step of forming color filters for realizing a color display, a step of fabricating cells by forming a liquid crystal panel by sealing liquid crystals between an element substrate having elements inclusive of a semiconductor and an opposing substrate having opposing electrodes, and a step of assembling a module by providing the liquid crystal panel assembled through the step of fabricating the cells with drive parts for operating the liquid crystal panel and with a back light thereby to complete a liquid crystal display device.

Here, the element substrate is the one in a state of before the display elements are completed in a step of fabricating the semiconductor display device.

An inspection step is often provided after the above steps though it may differ to some extent depending upon the kinds and specifications of the semiconductor display devices. If defective parts can be discriminated at an early step before the product is completed, then, the panel needs not be passed through the subsequent steps. Therefore, the inspection step is a very effective means from the standpoint of decreasing the cost.

Described below is the principle of the inspection method for confirming the operation of the pixel unit possessed by the semiconductor display device. The inspection includes three steps, i.e., accumulating an electric charge in a holding capacitor possessed by a pixel, holding the electric charge, and reading out the electric charge.

Referring, first, to FIG. 12A, a signal for inspection (hereinafter called inspection signal) is input to a signal line 1202 when a switching element 1201 possessed by a pixel is being turned on. Then, due to a current or a voltage of the inspection signal, an electric charge is accumulated in a holding capacitor 1203 provided in the pixels.

Referring, next, to FIG. 12B, the electric charge accumulated in the holding capacitor 1203 is stored therein when the switching element 1201 is turned off.

Referring to FIG. 12C, the switching element 1201 is turned on again to read the electric charge held in the holding capacitor 1203 through a signal line 1202. Relying upon the amount of electric charge that is read out, it is allowed to inspect whether the signal is normally input to the pixel and the electric charge is normally held by the holding capacitor.

In a real panel, the signal lines have not been directly connected to the connection terminals and, hence, passages are necessary for reading out the electric charge from the signal line to the connection terminal. As a passage for reading out the electric charge, a video signal line has so far been generally used.

FIG. 13A illustrates a general constitution of an element substrate of a semiconductor display device. The element substrate may be in a state where there have been completed the holding capacitors and semiconductor elements such as TFTs for controlling the accumulation of electric charge in the holding capacitors; i.e., the element substrate is in a state of before completing the display elements.

In FIG. 13A, a shift register 1211 generates a timing signal and inputs it to a sampling circuit 1212 in synchronism with a clock signal CK and a start pulse SP input to a signal line drive circuit 1210. In a sampling circuit 1212, a video signal line is electrically connected to signal lines S1 to S4 in synchronism with timing signals that are input. Hereinafter, the connection stands for an electric connection unless stated otherwise.

In the case of the element substrate shown in FIG. 13A, the electric charge can be read out from the signal line via the video signal line. Therefore, there is no need of changing the constitution of the element substrate for inspection, and the inspection is carried out relatively easily.

In recent years, however, it is a trend to use video signals of a digital form and to use an increased number of pixels, resulting in a complex connection constitution of the semiconductor elements in the pixels and a complex constitution of a signal line drive circuit, and the signal lines can no longer be simply connected to the video signal lines.

FIG. 13B illustrates the constitution of the element substrate of a semiconductor display device using digital video signals. In FIG. 13B, a shift register 1221 forms a timing signal and inputs it to a latch 1222 in synchronism with a clock signal CK and a start pulse signal SP input to a signal line drive circuit 1220. The latch 1222 latches a digital video signal input to the video signal line in synchronism with the timing signal that is input. The switching of the inverter 1223 that works as a buffer is controlled according to the digital video signal that is latched, and a power source voltage VDD or VSS (VDD>VSS) is given to the signal lines S1 to S4.

In the thus constituted element substrate, a digital video signal is input to the gates of two TFTs possessed by the inverter 1223, and the signal lines are connected to the drains of the two TFTs. Further, the video signal line is connected to the input side of the latch 1222. Here, however, the input side of the latch 1222 cannot necessarily be connected to the output side thereof. When the signal line drive circuit shown in FIG. 13B is used, therefore, it is difficult to electrically connect the video signal line to the signal lines, and it is not allowed to use the video signal line as a passage for reading the electric charge.

Therefore, a circuit dedicated to reading the electric charge (inspection-dedicated circuit) is used for inspecting the element substrate having the above constitution. FIG. 14 illustrates a state where an inspection-dedicated circuit is connected to the element substrate shown in FIG. 13A and FIG. 13B.

The inspection-dedicated circuit 1225 shown in FIG. 14 includes a sampling circuit 1227 for inspection which controls the connection of the signal lines S1 to S4 to an inspection-dedicated wiring 1228 used as a passage for reading the electric charge, and a shift register 1226 for inspection which controls the operation of the sampling circuit 1227 for inspection.

Owing to the above constitution, there is no need of using the video signal line as a passage for reading out the electric charge. Therefore, the electric charge can be read out even when the video signal line cannot be connected to the signal lines.

There, however, arouse some problems even when the inspection-dedicated circuit is used as shown in FIG. 14.

First, when the inspection-dedicated circuit is provided outside the element substrate, the inspection-dedicated circuit must be connected to the signal lines via connection terminals. Therefore, the element substrate must be provided with connection terminals for the inspection-dedicated circuit, and space for the connection terminals becomes useless after the inspection has been finished. Besides, increasing the area of the substrate for securing the place for arranging the connection terminals hinders the effort for realizing the semiconductor display devices in small sizes, and is not desirable.

When the inspection-dedicated circuit is fabricated on the same substrate as the pixel unit, further, the inspection-dedicated circuit that needs not be shipped with products becomes a factor that hinders the effort for decreasing the size of the semiconductor display devices. If the inspection-dedicated circuit were to be cut off by cutting the substrate after the inspection has been finished, the element substrates are obtained in a decreased number from a piece of large substrate which is a mother glass due to space occupied by the inspection-dedicated circuit.

SUMMARY OF THE INVENTION

In view of the above-mentioned problems, it is an object of the present invention to provide a method of electrically inspecting semiconductor display devices, which is capable of inspecting whether a signal is normally input to the pixels and whether an electric charge is normally held by the holding capacitors without using the video signal line as a passage for reading the electric charge and without separately providing an inspection-dedicated circuit.

The present inventors have given attention to that when the signal lines have not been connected to the video signal line, the signal line drive circuit is provided with a circuit or circuit elements that control the supply of power source voltage to the signal lines depending upon the video signal, and have contrived to use the power source lines which are used for supplying the power source voltage as a passage for reading the electric charge. Namely, the present invention has a feature in that one of the two power source lines that can be connected to the signal lines is used as a passage for inputting an inspection signal to the holding capacitors in the pixels and the other one is used as a passage for reading the electric charge from the holding capacitors in the pixels.

DESCRIPTION OF THE PREFERRED EMBODIMENTS

Figure 1:
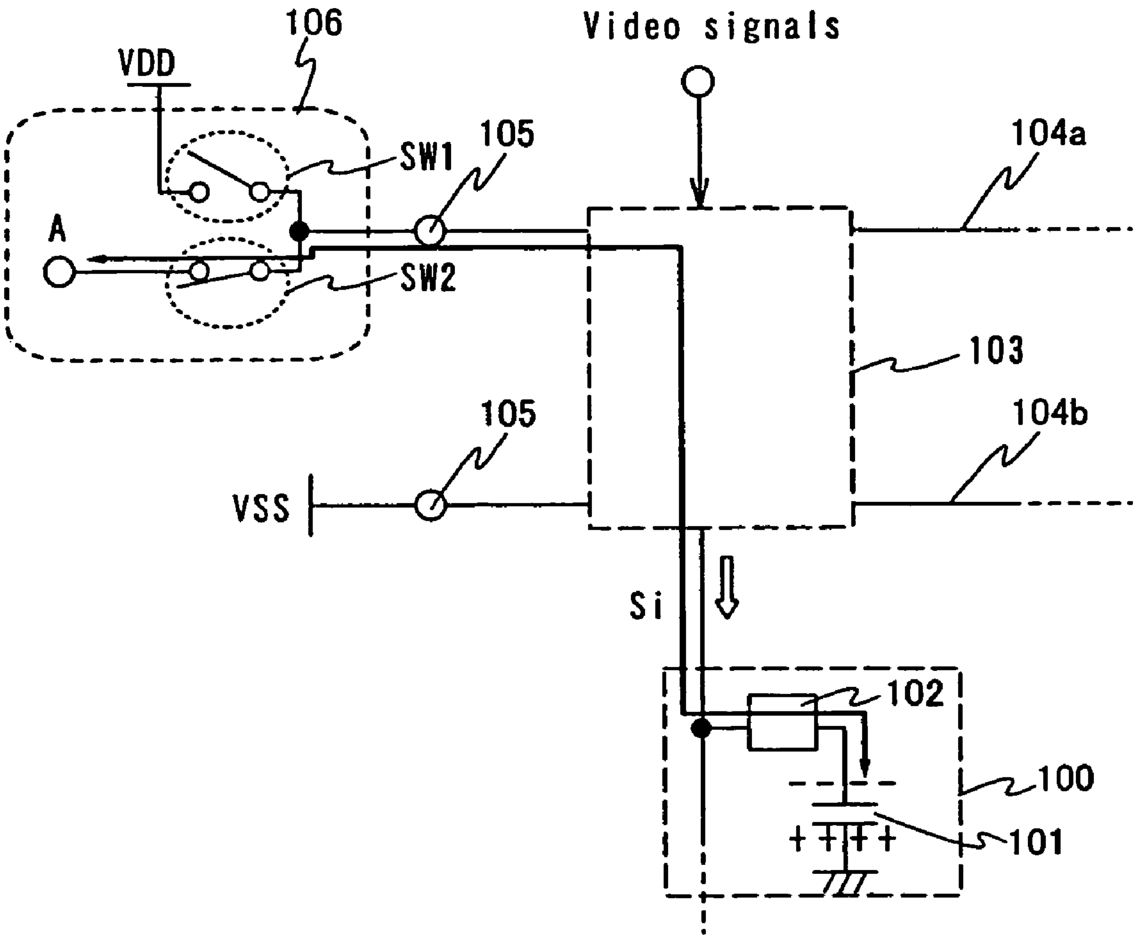
FIG. 1 is a diagram illustrating a generic concept of the inspection method of the invention.

A concept of an inspection method of the invention will now be described with reference to FIG. 1. In FIG. 1, a region surrounded by a broken line 100 corresponds to a pixel which includes a holding capacitor 101 for holding an electric charge accumulated due to an input signal and a switching element 102 for controlling the input of signal to the holding capacitor 101. Reference numeral 103 denotes means for controlling the connection of a signal line Si (i=1 to x) to the power source lines 104*a*, 104*b* according to video signals. Here, this means is called connection control circuit. The connection control circuit 103 may be means for controlling the connection between the signal lines and the power source lines, and includes, for example, an inverter, a clocked inverter and an analog switch.

A power source voltage VSS is supplied to the power source line 104*b*.

Either one of the power source lines (power source line 104*a* here) is connected, via a connection terminal 105, to measuring means 106 provided outside the element substrate. The measuring means 106 includes means for controlling the supply of the power source voltage VDD to the connection terminal 105, means for controlling the supply of power source voltage VDD to a measuring point A where the amount of electric charge is measured, and means for controlling the connection of the measuring point A to the connection terminal. Among these three means, a plurality of means may be encompassed by one means.

Concretely speaking, in FIG. 1, a first switch SW1 controls the supply of the power source voltage VDD to the connection terminal 105, and a second switch SW2 controls the connection between the measuring point A and the connection terminal. The supply of power source voltage VDD to the measuring point A is controlled by the switches SW1 and SW2. Namely, the first switch SW1 is controlling the connection between the power source line 104*a* and the power source (not shown) that supplies the power source voltage VDD.

Next, described below is the operations of the element substrate and of the measuring means at the time of inspection. The inspection method can be described being divided into four steps of accumulating the electric charge in the holding capacitor of the pixel, holding the electric charge, precharging the measuring point with a voltage and reading the electric charge.

As a first step, the connection control circuit 103 is controlled by a dummy video signal for inspection to connect the signal line Si to the power source line 104*b*, and the power source voltage VSS corresponding to the inspection signal is fed to the signal line Si. Further, the switching element 102 is turned on so that the electric charge is accumulated in the holding capacitor 101 due to the power source voltage VSS.

Next, as the second step, the switching element 102 is turned off enabling the electric charge to be held by the holding capacitor 101.

Next, as the third step, SW1 is turned on, SW2 is turned on, after separating the power source line 104*b* away from the signal line Si, the connection control circuit 103 is controlled by the dummy video signal for inspection, and the signal line Si is connected to the power source line 104*a*. Owing to the above constitution, the power source voltage VDD is supplied to the passage of from the measuring point A to the signal line Si and, hence, the measuring point is placed in a state of being precharged.

Next, as the fourth step, SW1 is turned off, SW2 is turned on, and the measuring point A is placed in a floating state. Then, the switching element 102 is turned on to measure the voltage, current or waveform thereof at the measuring point A. It is, thus, made possible to read out the electric charge accumulated in the holding capacitor in the pixel, and to make sure if the signal is normally input to the pixel and if the electric charge is normally held by the holding capacitor.

In the case of FIG. 1, the inspection signal has the voltage VSS, and the measuring point A assumes the voltage VDD just before being read out. When the signal is normally input to the pixel and when the electric charge is normally held by the holding capacity, the voltage, current or waveform thereof at the measuring point A fluctuates by the amount of electric charge that is read out.

Further, the inspection can be quickened upon simultaneously conducting the operation of the second step and the operation of the third step.

Owing to the above-mentioned constitution, there is no need of using the video signal line as a passage for reading out the electric charge. Accordingly, the electric charge can be read out even when the video signal line cannot be connected to the signal lines in the signal line drive circuit. Further, since there is no need of providing the inspection-dedicated circuit, there is no factor that hinders the effort for realizing the semiconductor display devices in small sizes. Without being occupied by the inspection-dedicated circuit, further, there is no decrease in the number of pieces of element substrates that can be obtained from a piece of large substrate. Besides, the inspection can be easily conducted without changing the constitution of the element substrate.

The inspection method of the present invention can be applied not only to the element substrates of the light-emitting devices that produce a display by using digital video signals but also to the element substrates of the light-emitting devices that produce a display by using analog video signals.

It is also allowable to employ the inspection method of the present invention after the display elements have been formed or after the semiconductor display device has been completed.

MODE FOR CARRYING OUT THE INVENTION

Mode 1.

In this mode is described the inspection method of the invention in detail.

Figure 2A:
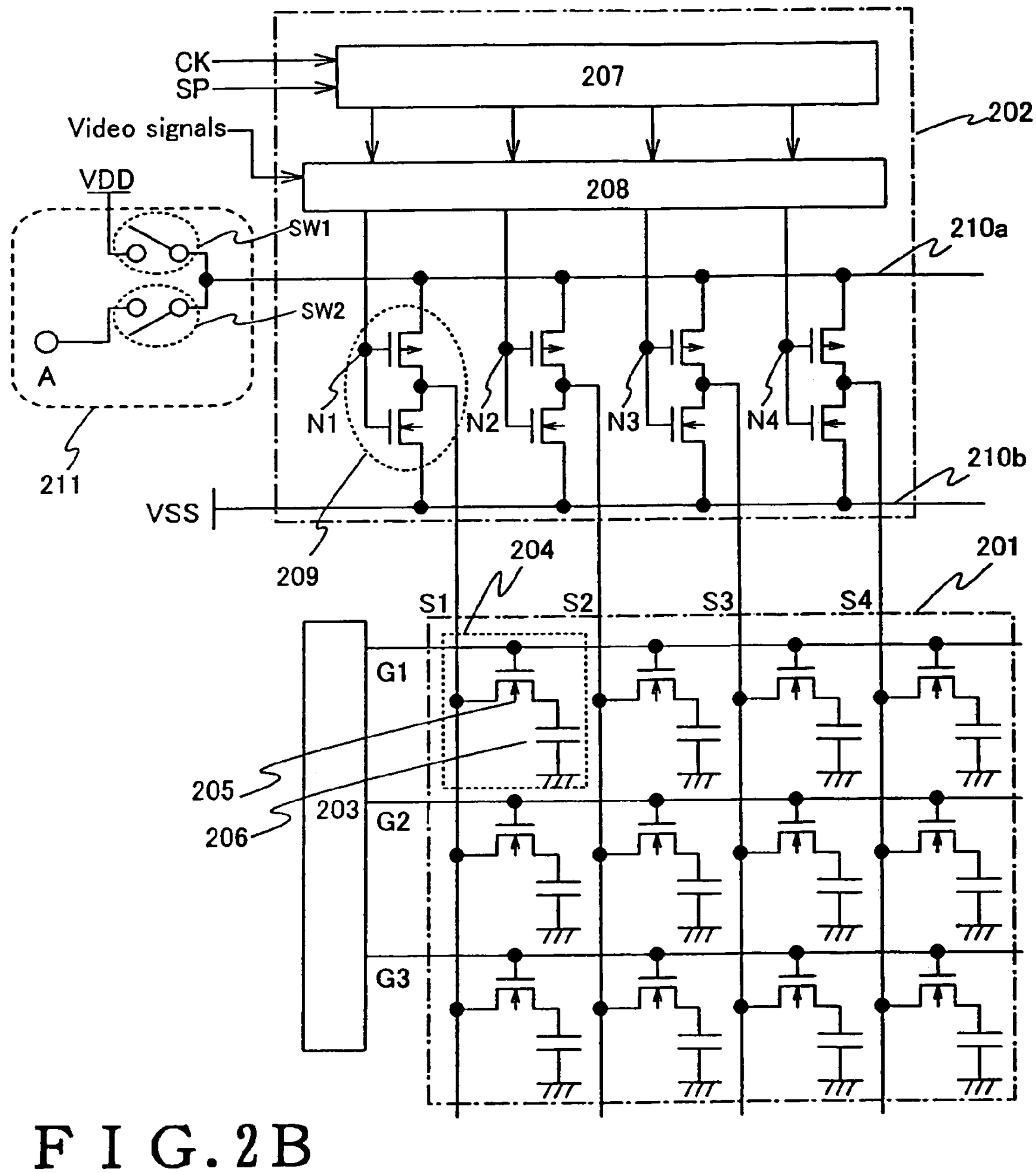
FIG. 2A and FIG. 2B are diagrams illustrating a relationship of connection between an element substrate and measuring means.
Figure 2B:
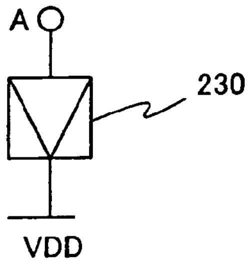

FIG. 2A illustrates the constitution of an element substrate to be inspected and of measuring means. The element substrate includes a pixel unit 201, a signal line drive circuit 202 and a scanning line drive circuit 203. The pixel unit 201 is provided with signal lines S1 to S4, and scanning lines G1 to G3. The wirings provided in the pixel unit are not limited to the above signal lines and scanning lines only, but may include any other wiring. Further, the numbers of the signal lines and scanning lines are not limited thereto, either.

A region including one signal line and one scanning line corresponds to a pixel 204, and a plurality of pixels 204 are provided in the pixel unit 201. Each pixel is provided with a switching element which in FIG. 2A is a TFT 205. Further, each pixel includes a holding capacitor 206.

The signal line drive circuit 202 includes a shift register 207, a latch 208 and an inverter 209. The inverter 209 corresponds to the connection control circuit and controls the connection of the power source lines 210*a*, 210*b* to the signal lines S1 to S4 depending upon a video signal input from the latch 208.

The inverter 209 has an n-channel TFT and a p-channel TFT. The two TFTs have their gates connected together, the source of the p-channel TFT being connected to the power source line 210*a* and the source of the n-channel TFT being connected to the power source line 210*b*. Further, the two TFTs have their drains connected together.

The power source line 210*a* is connected to the measuring means 211, and the power source line 210*b* is served with the power source voltage VSS.

The measuring means 211 has a first switch SW1 for controlling the supply of the power source voltage VDD to the connection terminal and a second switch SW2 for controlling the connection between the connection terminal and the measuring point A where the amount of electric charge is measured. The supply of power source voltage VDD to the measuring point A is controlled by SW1 and SW2.

Next, described below are the operations of the element substrate and of the measuring means at the time of inspection. As described above, the inspection method of the present invention can be described being divided into four steps of accumulating the electric charge in the holding capacitor of the pixel, holding the electric charge, precharging the measuring point with a voltage and reading the electric charge.

Figure 3:
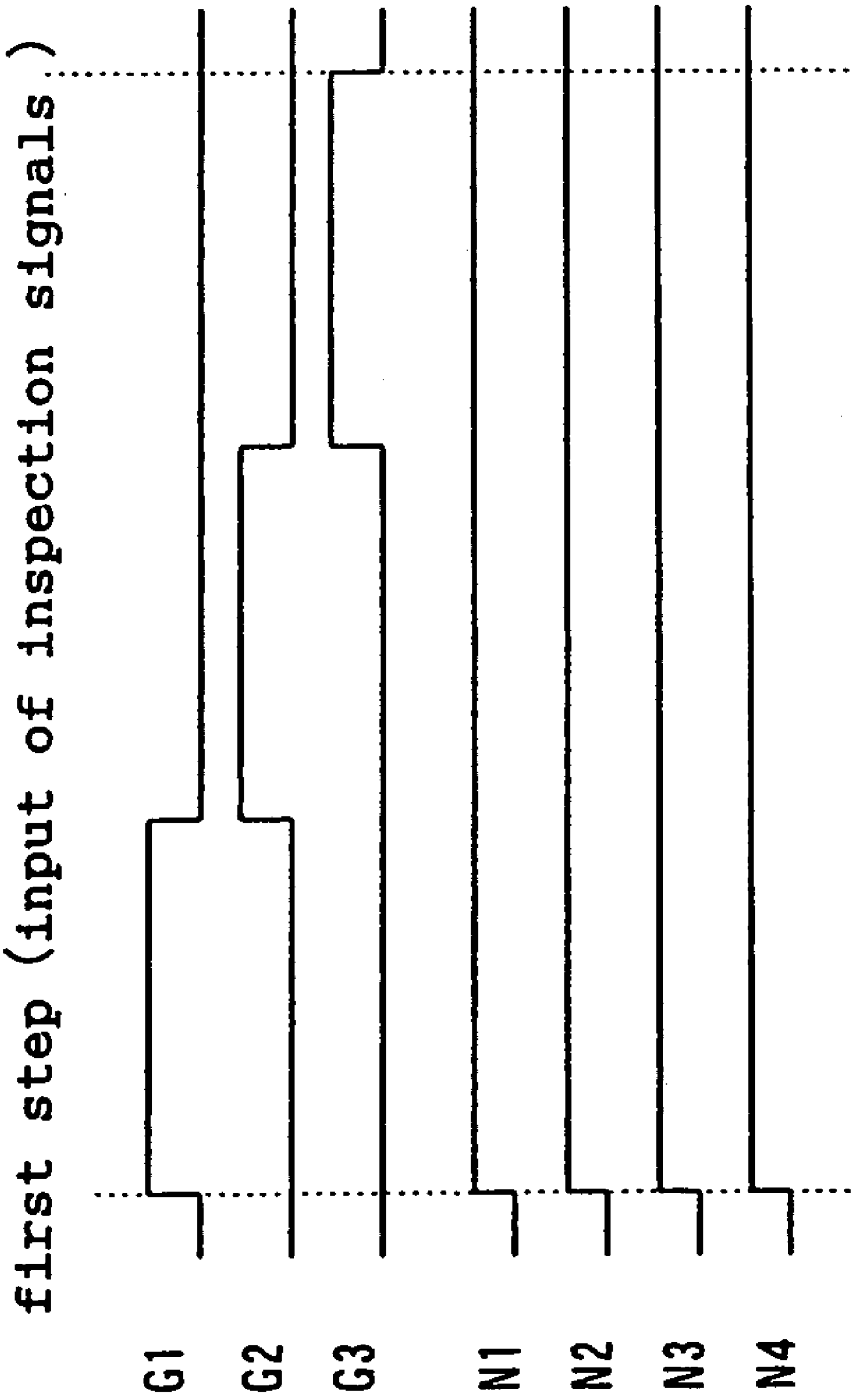
FIG. 3 is a timing chart at the time of inspection.
Figure 5A:
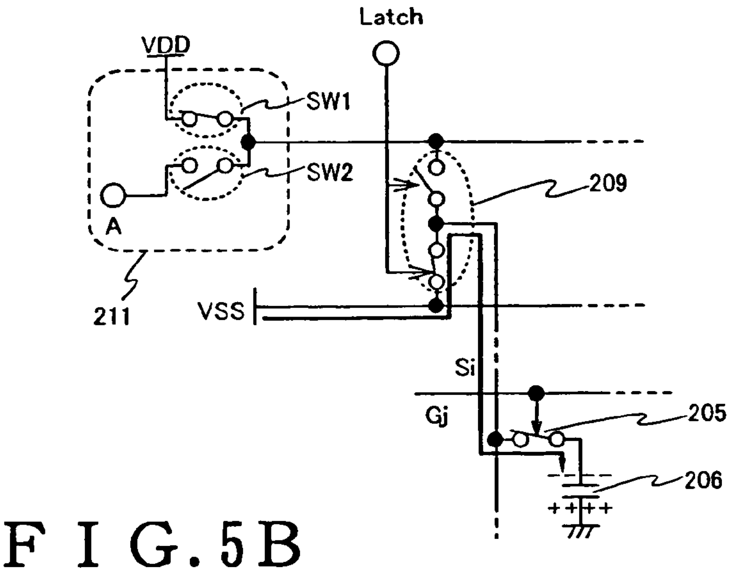
FIGS. 5A-C are diagrams illustrating relationships between measuring means and measuring means at the time of inspection.
Figure 5B:
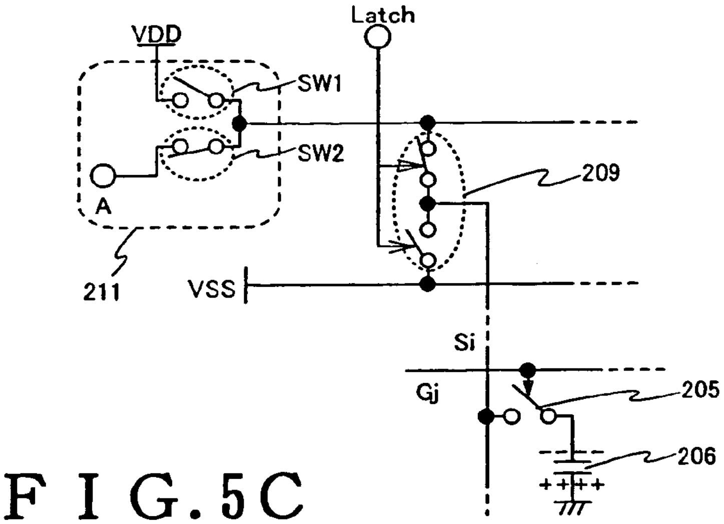
Figure 5C:
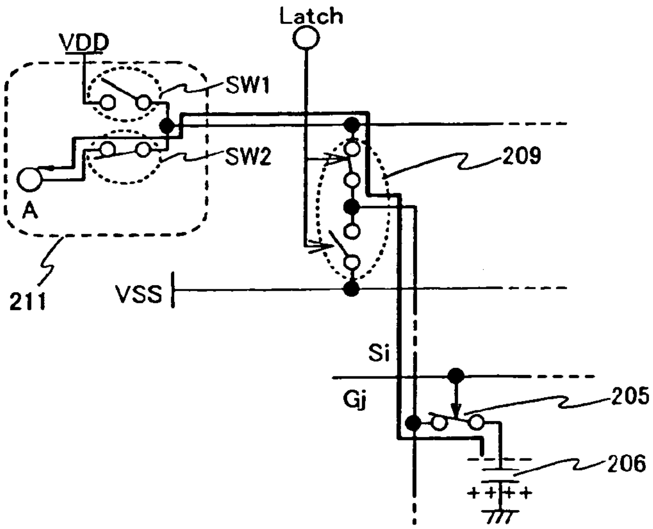

FIG. 3 is a timing chart illustrating signals input to the scanning lines G1 to G3 and signals input to the gates (denoted as nodes N1 to N4 in FIG. 2A) of the two TFTs possessed by the inverter 209 in the first step. FIG. 5A schematically illustrates the operations of the measuring means 211, of the inverter 209 and of the TFT 205 and holding capacitor 206 possessed by the pixel 204 in the first step. In FIGS. 5A-C, Si denotes any one of S1 to S4, and Gj denotes any one of G1 to G3.

In the first step, the inverter 209 corresponding to the connection control circuit is controlled by a dummy video signal for inspection, whereby the signal lines S1 to S4 are connected to the power source line 210*b* to supply the power source voltage VSS corresponding to the inspection signal to the signal lines S1 to S4. The scanning lines G1 to G3 are successively or simultaneously selected by the scanning line drive circuit 203, so that the switching elements 205 in the pixels are turned on thereby to accumulate the electric charge corresponding to the power source voltage VSS in the holding capacitors 206. In FIG. 2A, the scanning lines G1 to G3 are successively selected.

Then, the operation starts in the second step. Namely, in the second step, the TFTs 205 are turned off in all pixels enabling the electric charge to be held by the holding capacitors 206.

Then, the operation starts in the third step. In the third step, SW1 is turned on, SW2 is turned on, the inverter 209 is controlled by a dummy video signal for inspection, and the signal lines S1 to S4 are connected to the power source line 204*a*. Owing to the above constitution, the power source voltage VDD is supplied to the passage of from the measuring point A to the signal lines S1 to S4, whereby the measuring point is placed in a precharged state.

The operations of the second step and of the third step may be carried out in parallel with each other. FIG. 5B schematically illustrates the operations of the measuring means 211, of the inverter 209, and of the TFT 205 and holding capacitor 206 possessed by the pixel 204 in the second and third steps.

Figure 4:
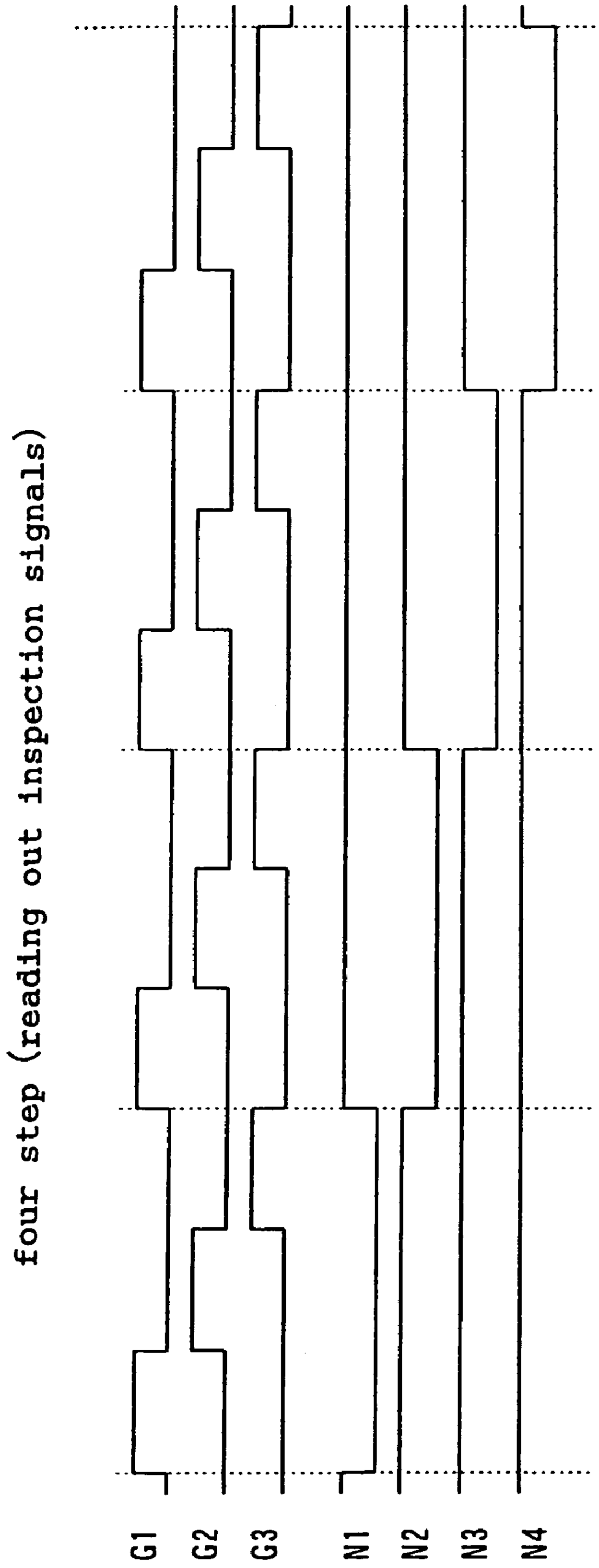
FIG. 4 is a timing chart at the time of inspection.

Next, the operation of the fourth step starts. FIG. 4 is a timing chart illustrating the signals input to the scanning lines G1 to G3 and the signals input to the nodes N1 to N4 in the fourth step. Further, FIG. 5C schematically illustrates the operations of the measuring means 211, of the inverter 209 and of the TFT 205 and holding capacitor 206 possessed by the pixel 204 in the fourth step.

Next, in the fourth step, SW1 is turned off and SW2 is turned on. Then, the inverter 209 is controlled by the dummy video signal for inspection, and the signal lines S1 to S4 are successively connected to the power source line 210*a*. During a period in which any signal line is connected to the power source line 210*a*, the scanning lines G1 to G3 are successively selected by the scanning line drive circuit 203 thereby to turn on the TFTs 205 in the pixels on each of the rows. By measuring the voltage, current or waveform thereof at the measuring point A, the electric charge can be successively read from the holding capacitors 206 of the pixels of which the TFTs 205 are connected to the above signal line through the above signal line connected to the power source line 210*b*. From the amount of electric charge that is read out, it can be confirmed whether the signal is normally input to the pixels and whether the electric charge is normally held by the holding capacitors.

Referring to FIG. 2A, fluctuation in the current at the measuring point A may be measured by using a sense amplifier 230. Here, however, the fixed voltage supplied to the sense amplifier is set to be equal to the power source voltage for precharging.

Mode 2.

In this mode, the power source line 210*b* of the element substrate shown in FIG. 2A is used as a passage for reading the electric charge.

Figure 6:
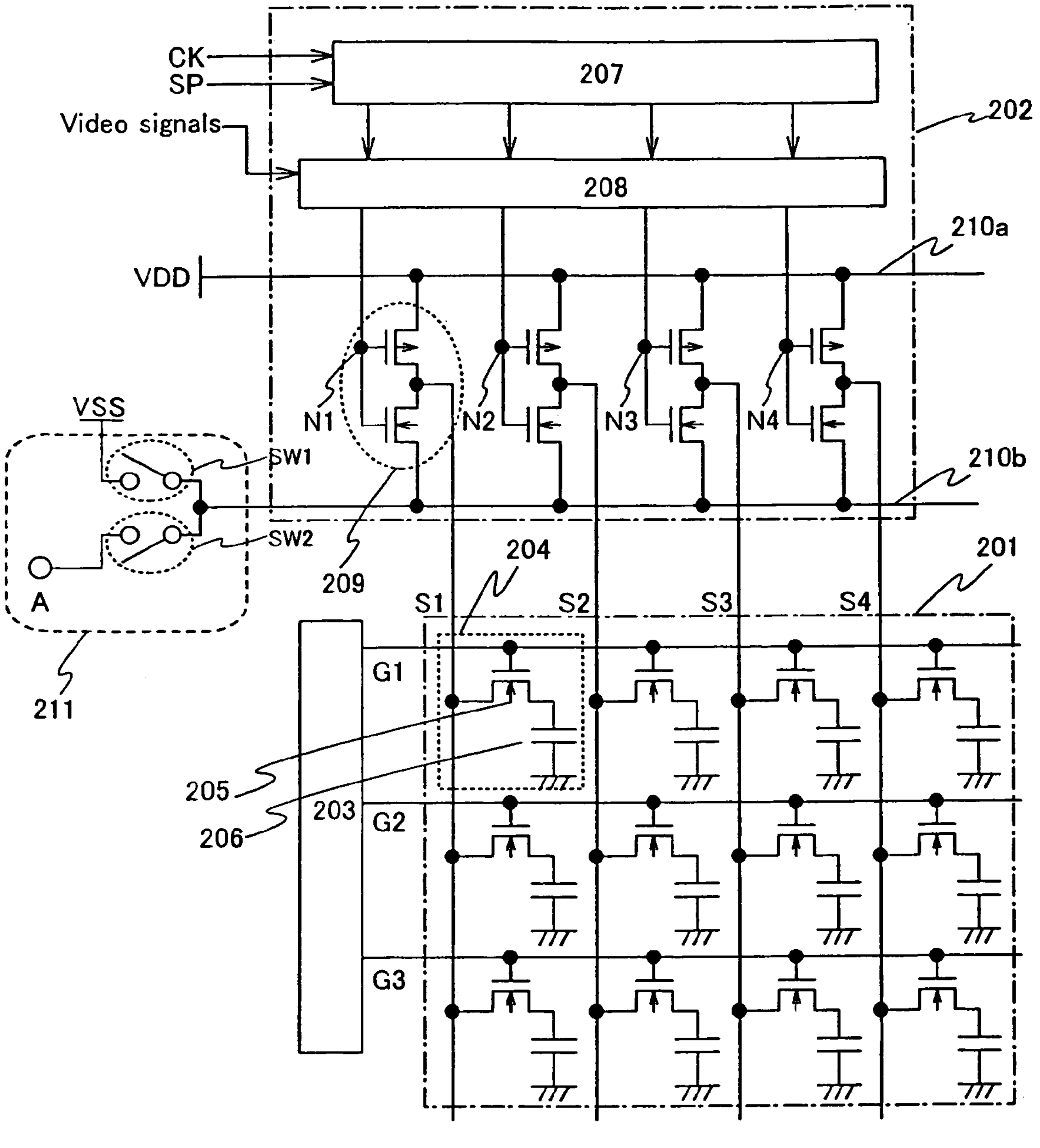
FIGS. 6 is a diagram illustrating a relationship of connection between an element substrate and measuring means.

FIG. 6 illustrates the constitution of the element substrate to be inspected and of the measuring means. The element substrate has the same constitution as the one shown in FIG. 2A, and the portions described already are denoted by the same reference numerals.

In FIG. 6, the measuring means 211 has the first switch SW1 for controlling the supply of power source voltage VSS to the connection terminal and the second switch SW2 for controlling the connection of the connection terminal to the measuring point A at where the amount of electric charge is to be measured. The supply of power source voltage VSS to the measuring point A is controlled by SW1 and SW2.

Operations of the switches in the measuring means at the time of inspection are the same as those of the case of the mode 1. Like in the case of the mode 1, the inspection method can be described being divided into four steps of accumulating the electric charge in the holding capacitor of the pixel, holding the electric charge, precharging the measuring point with a voltage and reading the electric charge. In these steps, however, the signal lines S1 to S4 are connected to the power source lines 210*a*, 210*b* in a different manner.

In the mode 1, the signal lines S1 to S4 are connected to the power source line 210*b* in the first step, and the power source voltage VSS is applied as the inspection signal. In this embodiment, however, the signal lines S1 to S4 are connected to the power source line 210*a* in the first step, and the power source voltage VDD is applied as the inspection signal.

In the mode 1, further, the signal lines S1 to S4 are connected to the power source line 204*a* in the third step, and the power source voltage VDD is supplied to the passage of from the measuring point A to the signal lines S1 to S4. In this mode, however, the signal lines S1 to S4 are connected to the power source line 204*b* in the third step, and the power source voltage VSS is supplied to the passage of from the measuring point A to the signal lines S1 to S4.

In the mode 1, the signal lines S1 to S4 are successively connected to the power source line 210*a* in the fourth step. In this embodiment, however, the signal lines S1 to S4 are successively connected to the power source line 210*b* in the fourth step.

Mode 3.

This mode deals with the constitution of pixels at the time of inspection and the constitution of pixels in a state after the inspection and after the display elements have been completed.

Figure 7A:
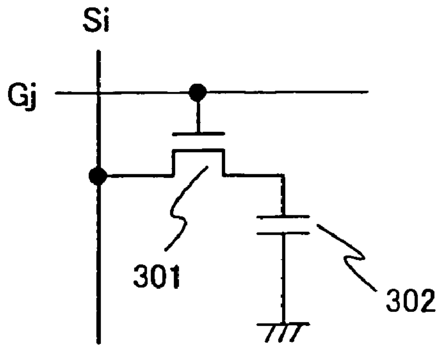
FIGS. 7A-F are diagrams illustrating the constitutions of pixels at the time of inspection and after the inspection.

FIG. 7A illustrates a pixel at the time of inspection. The pixel shown in FIG. 7A has the same constitution as that of the pixel shown in FIG. 2A and the pixel of the element substrate shown in FIG. 6. Reference numeral 301 denotes a TFT that works as a switching element. The element substrates shown in FIG. 2A and FIG. 6 use n-channel TFTs. However, p-channel TFTs may be used in their place.

Reference numeral 302 denotes a holding capacitor. The gate of TFT 301 is connected to the scanning line Gj (j=1 to y). Either the source or the drain of TFT 301 is connected to the signal line Si (k=1 to x) and the other one is connected to one electrode of the holding capacitor 302. The power source voltage is applied to the other electrode of the holding capacitor 302.

Figure 7B:
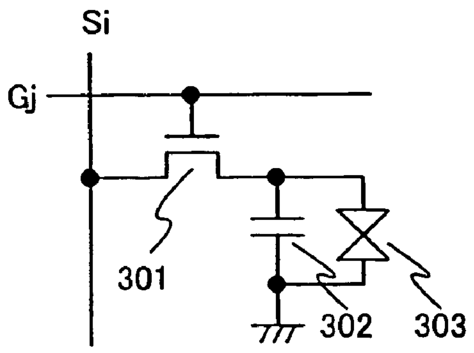

FIG. 7B illustrates a pixel of when there is formed a liquid crystal cell which is a display element after the pixel shown in FIG. 7A has been inspected. In FIG. 7B, reference numeral 303 denotes a liquid crystal cell which has a pixel electrode, an opposing electrode and a layer of liquid crystals (liquid crystal layer) sandwiched between the two electrodes. The pixel electrode of the liquid crystal cell 303 is connected to either the source or the drain of TFT 301, i.e., connected to the one which is not the one that is connected to the signal line Si. Further, the opposing electrode of the liquid crystal cell 303 is connected to the one electrode of the holding capacitor 302 to which the power source voltage is applied.

While the TFT 301 is being turned off, the voltage applied across the pixel electrode and the opposing electrode of the liquid crystal cell 303 is held by the holding capacitor 302.

Figure 7C:
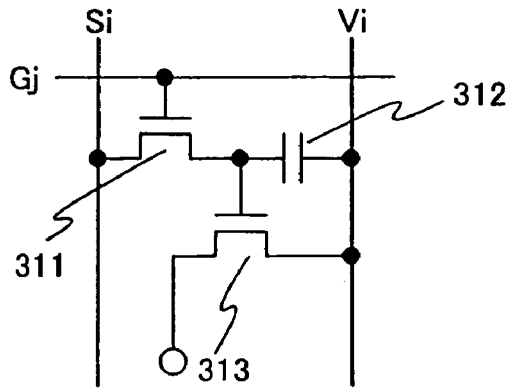

FIG. 7C illustrates another pixel at the time of inspection. Reference numeral 311 denotes a TFT that works as a switching element, and there is no limitation on the polarity thereof. Reference numeral 312 denotes a holding capacitor, and TFT 313 is an element which controls an electric current supplied to a display element that will be formed later.

The gate of the TFT 311 is connected to the scanning line Gj (j=1 to y). Either the source or the drain of the TFT 311 is connected to the signal line Si (i=1 to x) and the other one is connected to the gate of TFT 313. Either the source or the drain of the TFT 313 is connected to the current feeder line Vi (i=1 to x). Either one of the two electrodes of the holding capacitor 312 is connected to the gate of the TFT 313 and the other one is connected to the current feeder line Vi.

Figure 7D:
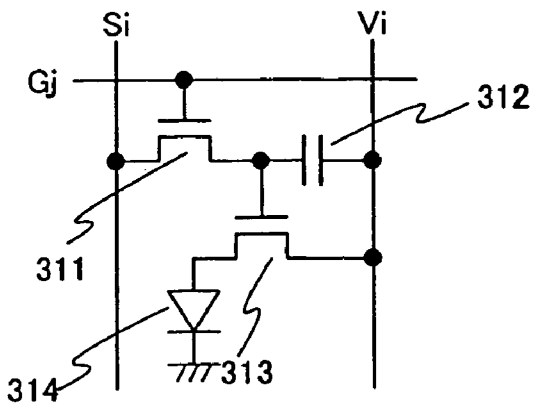

FIG. 7D illustrates a pixel of when there is formed a light-emitting element which is a display element after the pixel shown in FIG. 7C has been inspected. The light-emitting element includes a layer of a field light-emitting material (hereinafter referred to as field light-emitting layer) that generates electroluminescence upon the application of an electric field, an anode and a cathode. The field light-emitting layer is provided between the anode and the cathode, and is constituted by a single layer or a plurality of layers. These layers may be formed of an organic compound alone or of an inorganic compound alone. Or, these layers may be formed of a mixture of an organic compound and an inorganic compound. Or, these layers may be partly mixed together.

In FIG. 7D, reference numeral 314 denotes a light-emitting element of which the anode is connected to either the source or the drain of the TFT 313, i.e., connected to the one different from the one that is connected to the current feeder line Vi. Further, the power source voltage is applied to the cathode of the light-emitting element 314.

The gate voltage of TFT 313 is held by the holding capacitor 312 while the TFT 311 is being turned off.

The anode and the cathode of the light-emitting element 314 may be connected in a reversed manner. Concretely speaking, the cathode of the light-emitting element 314 may be connected to either the source or the drain of the TFT 313, i.e., connected to the one different from the one that is connected to the current feeder line Vi, and the power source voltage may be applied to the anode of the light-emitting element 314.

Figure 7E:
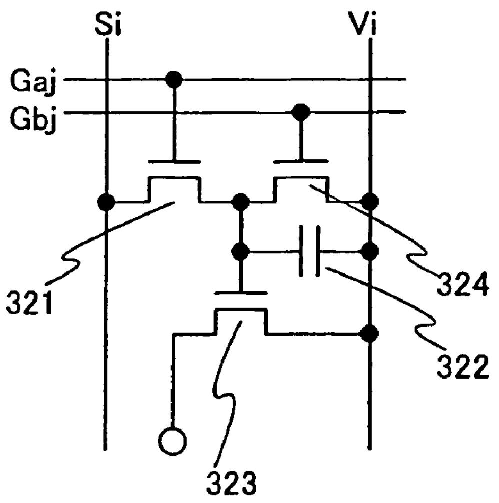

Next, FIG. 7E illustrates another pixel at the time of inspection, wherein reference numeral 321 denotes a TFT that works as a switching element and there is no limitation on the polarity thereof. Reference numeral 322 denotes a holding capacitor. Further, an element TFT 323 is for controlling a current to be supplied to a display element that will be formed later. An element TFT 324 is for controlling a gate voltage of the TFT 323.

The gate of the TFT 321 is connected to the first scanning line Gaj (j=1 to y). Either the source or the drain of TFT 321 is connected to the signal line Si (i=1 to x) and the other one is connected to the gate of TFT 323. The gate of the TFT 324 is connected to the second scanning line Gbj (j=1 to y). Either the source or the drain of the TFT 324 is connected to the current feeder line Vi (i=1 to x) and the other one is connected to the gate of the TFT 323. Either the source or the drain of the TFT 323 is connected to the current feeder line Vi (i=1 to x). Either one of the two electrodes of the holding capacitor 322 is connected to the gate of TFT 323 and the other one is connected to the current feeder line Vi.

Figure 7F:
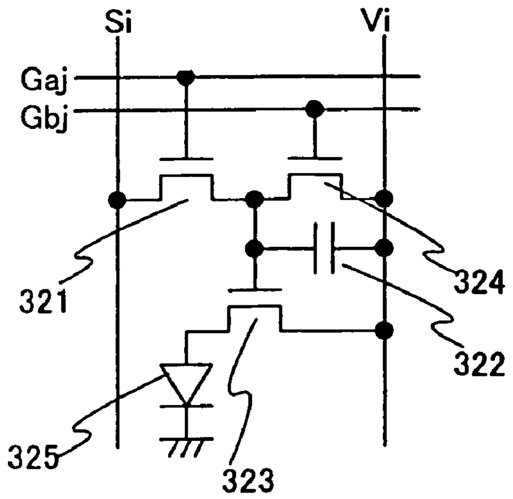

FIG. 7F illustrates a pixel of when there is formed a light-emitting element which is a display element after the pixel shown in FIG. 7E has been inspected. In FIG. 7F, reference numeral 325 denotes a light-emitting element of which the anode is connected to either the source or the drain of the TFT 323, i.e., connected to the one different from the one that is connected to the current feeder line Vi. Further, the power source voltage is applied to the cathode of the light-emitting element 325.

The gate voltage of the TFT 323 is held by the holding capacitor 322 while the TFT 321 and TFT 324 are turned off.

The anode and cathode of the light-emitting element 325 may be connected in a reversed manner. Concretely speaking, the cathode of the light-emitting element 325 is connected to either the source or the drain of TFT 323, i.e., connected to the one different from the one that is connected to the current feeder line Vi, and the power source voltage is applied to the anode of the light-emitting element 325.

In the pixel which uses the inspection method of the present invention, the switching element is not limited to the constitutions shown in FIGS. 7A to 7F only, but may be realized by using the TFT in combination with one or a plurality of other semiconductor elements.

The pixel that uses the inspection method of the present invention is in no way limited to those of the above-mentioned constitutions only.

The above modes 1 to 3 have described the inspection of the element substrate. It is, however, also allowable to use the inspection method of the present invention after the display elements have been formed or after the semiconductor display device has been completed.

EMBODIMENTS

Embodiments of the present invention will now be described.

Embodiment 1

This embodiment deals with the constitution of the pixel shown in FIGS. 7C and 7D with reference to a sectional view of the pixel at the time of conducting the inspection method of the invention and a sectional view of the pixel when the light-emitting element is completed after the inspection finishes.

Figure 8A:
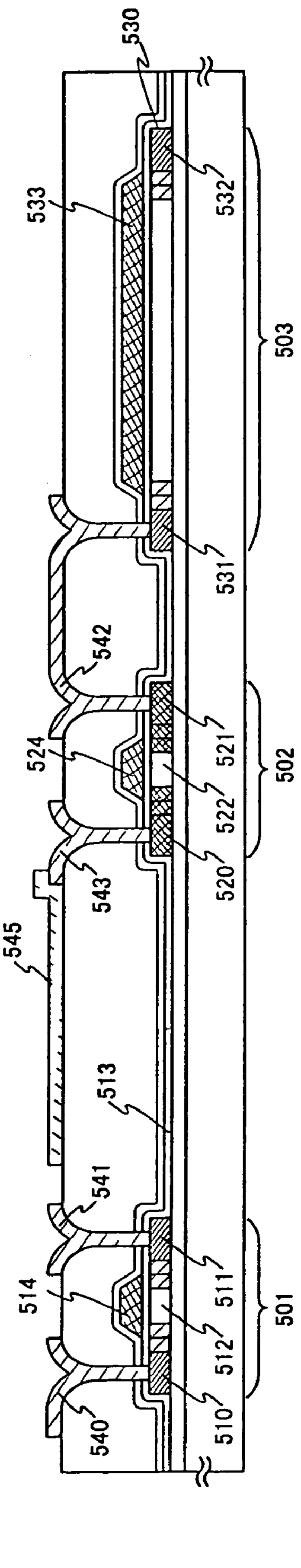
FIG. 8A and FIG. 8B are diagrams illustrating the sectional structures of a pixel at the time of inspection and after the inspection.

FIG. 8A is a sectional view of the pixel at the time of inspection, wherein reference numeral 501 denotes a TFT that works as a switching element, 502 denotes a TFT for controlling a current fed to a light-emitting element that will be formed later, and 503 denotes a holding capacitor.

The TFT 501 includes impurity regions 510 and 511 that work as source and drain, a channel-forming region 512 provided between the above two impurity regions, a gate-insulating film 513, and an electrode 514 that works as a gate. The electrode 514 is overlapping the channel-forming region 512 with the gate-insulating film 513 sandwiched therebetween.

The TFT 502 includes impurity regions 520 and 521 that work as source and drain, a channel-forming region 522 provided between the above two impurity regions, a gate-insulating film 513, and an electrode 524 that works as a gate. The electrode 524 is overlapping the channel-forming region 522 with the gate-insulating film 513 sandwiched therebetween.

The holding capacitor 503 corresponds to a portion where a semiconductor film 530 for a holding capacitor forming impurity regions 531, 532 in some portions thereof, is overlapping the electrode 533 for the holding capacitor with the gate-insulating film 513 sandwiched therebetween.

The impurity region 510 of the TFT 501 is connected to a wiring 540 that works as a signal line, and the impurity region 511 is connected to a wiring 541. Though not illustrated in FIG. 8A and FIG. 8B, the wiring 541 is directly or electrically connected to the electrode 524 of the TFT 502.

The impurity region 521 of the TFT 502 is connected to a wiring 542 that works as a current feeder line, and the wiring 542 is connected to the impurity region 531 possessed by the semiconductor film 530 for the holding capacitor. Further, though not illustrated in FIG. 8A and FIG. 8B, the electrode 533 for the holding capacitor is directly or electrically connected to the electrode 524 of the TFT 502.

The impurity region 520 is connected to an anode 545 via a wiring 543.

In the element substrate constituted as illustrated in FIG. 8A, the inspection method of the present invention is conducted to inspect whether the signal is normally input to the pixel and whether the electric charge is normally held by the holding capacitor. The inspection method of the present invention can be put into practice provided the element substrate is in a state where the pixels have been formed to such a degree that a series of operations can be conducted, i.e., the electric charge is accumulated in the holding capacitors due to the input of an inspection signal, the electric charge is held and the electric charge is read out. In the case of the light-emitting device shown in FIG. 8B, therefore, the inspection method can be conducted either prior to forming the anode 545 or after the anode 545 has been formed. The inspection can further be conducted even in a state of after having formed the electrically conducting film from which the anode is to be formed but prior to forming the anode by patterning. The inspection can be further conducted after the light-emitting elements are sealed and after the semiconductor display device has been completed.

Figure 8B:
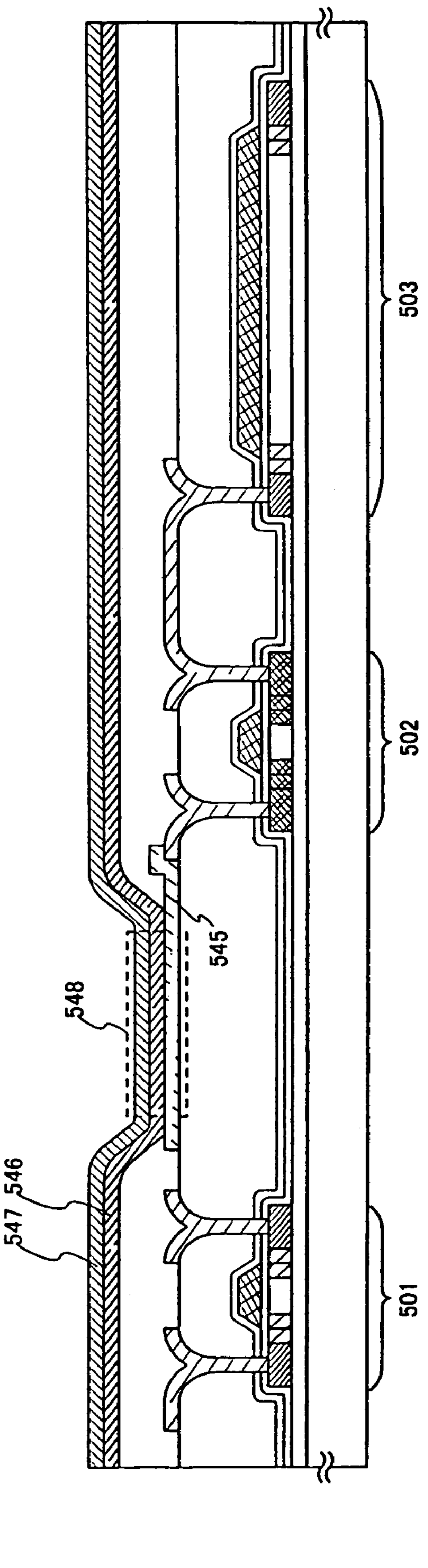

After the inspection has been finished, a field light-emitting layer 546 and a cathode 547 are formed on the anode to thereby complete a light-emitting element 548 as shown in FIG. 8B. In practice, after the cathode 547 has been formed, the light-emitting element 548 is sealed so will not to be exposed to the atmosphere.

Embodiment 2

Figure 9:
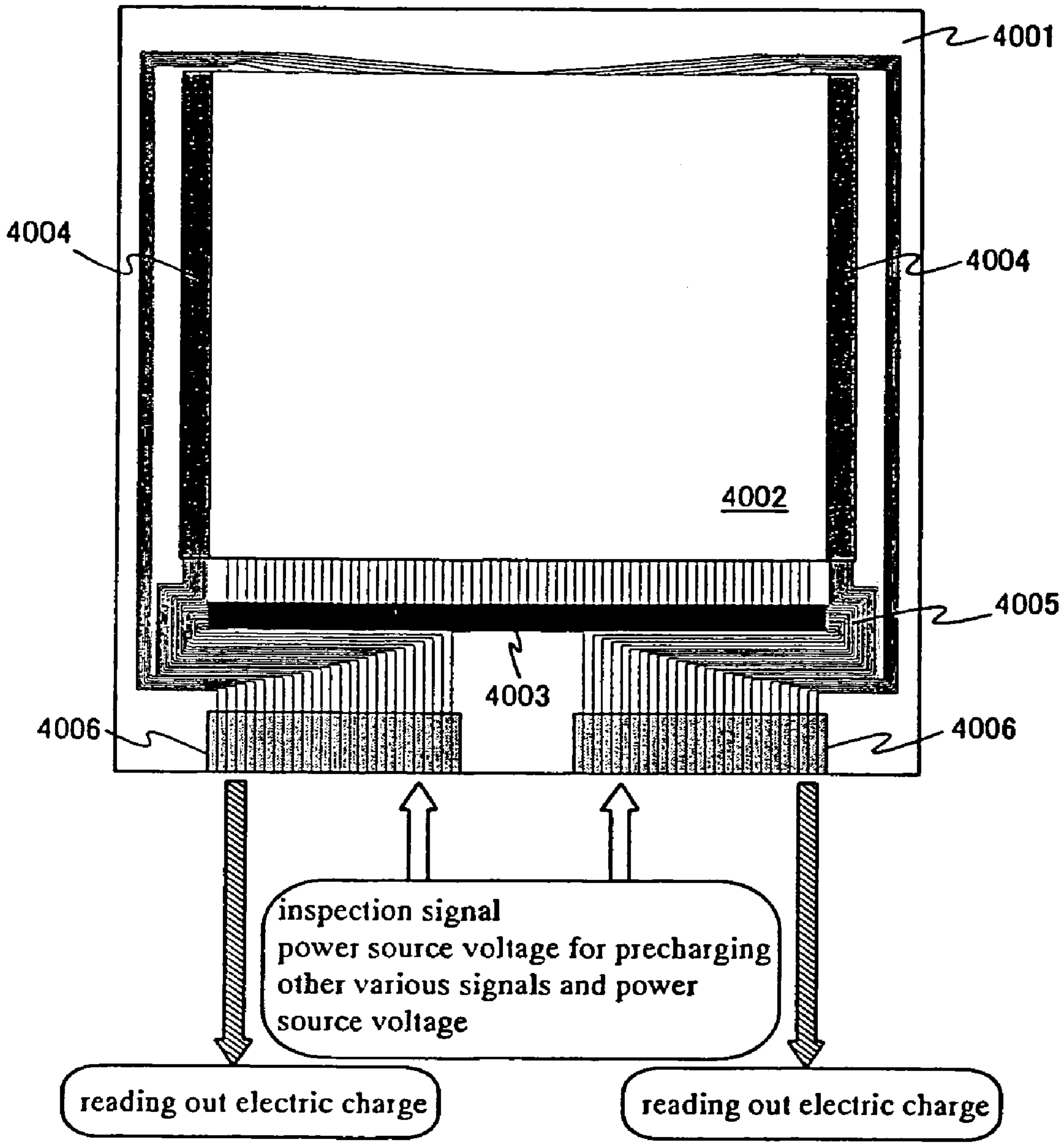
FIG. 9 is a top view of the element substrate at the time of inspection.

This embodiment deals with the connection of the power source lines to the connection wirings. FIG. 9 is a top view of the element substrate.

The element substrate shown in FIG. 9 includes a pixel unit 4002, a signal line drive circuit 4003 and scanning line drive circuits 4004 that are formed on a substrate 4001.

Reference numeral 4006 denotes connection terminals. Various signals and the power source voltage input to the connection terminals 4006 are fed to the pixel unit 4002, signal line drive circuit 4003 and scanning line drive circuits 4004 via a run-about wiring 4005 running about on the substrate 4001.

In the inspection method of the present invention, the power source voltage which is the inspection signal given from the measuring means, the power source voltage for precharging, various signals and power source voltage necessary for operating the pixel unit 4002, signal line drive circuit 4003 and scanning line drive circuits 4004 at the time of inspection, are fed to the element substrate via the connection terminal 4006. The electric charge is also read out via the connection terminals 4006.

Embodiment 3

This embodiment deals with a method of inspecting the element substrate different from that of FIG. 2A.

Figure 10A:
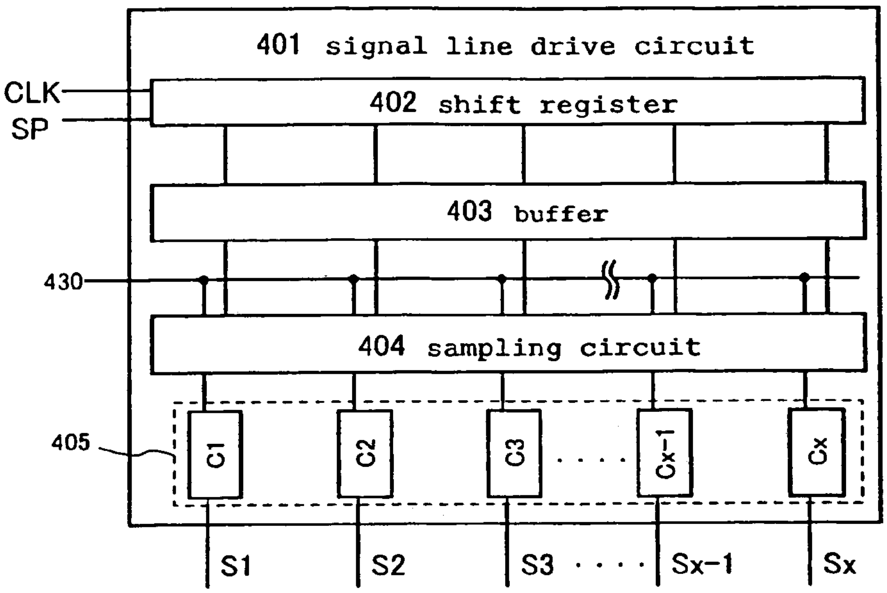
FIG. 10A and FIG. 10B are views illustrating the constitution of a signal line drive circuit.

FIG. 10A illustrates the constitution of a signal line drive circuit on the element substrate to which the inspection method of the invention can be applied. The signal line drive circuit 401 of this embodiment includes a shift register 402, a buffer 403, a sampling circuit 404 and a current converter circuit 405.

A timing signal is formed as a clock signal CK and a start pulse signal SP is input to the shift register 402. The timing signal that is formed is amplified or buffered and amplified through the buffer 403, and is input to the sampling circuit 404. A level shifter may be provided instead of the buffer to amplify the timing signal. Further, both the buffer and the level shifter may be provided.

In the sampling circuit 404, analog video signals input from the video signal line 430 are fed to the current converter circuit 405 of a subsequent stage in synchronism with the timing signal. The current converter circuit 405 forms a current of a magnitude that meets the voltage of the analog video signal that is input, and feeds it to the corresponding signal lines S1 to Sx.

Figure 10B:
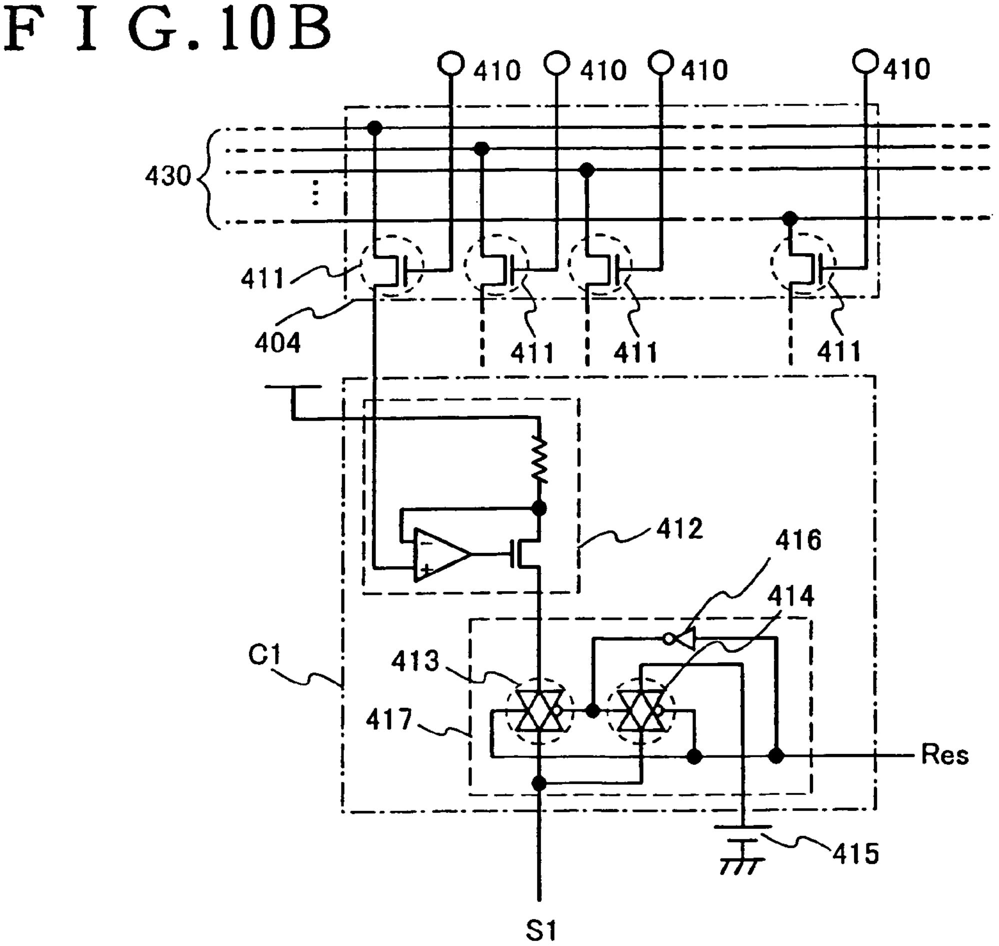

FIG. 10B illustrates concrete constitutions of the sampling circuit 404 and of current-setting circuits C1 to Cx possessed by the current converter circuit 405. The sampling circuit 404 is connected to the buffer 403 through terminals 410.

The sampling circuit 404 is provided with a plurality of switches 411. The sampling circuit 404 receives analog video signals from the video signal lines 430, and the switches 411 work to sample the analog video signals in synchronism with the timing signals and feeds them to the current-setting circuit C1 in a subsequent stage. Though FIG. 10B illustrates the current-setting circuit C1 only that is connected to one of the switches 411 possessed by the sampling circuit 404, among the current-setting circuits C1 to Cx, it should be noted that the current-setting circuit C1 as shown in FIG. 10B is connected to a stage succeeding the switches 411.

The analog video signals that are sampled are input to a current output circuit 412 possessed by the current-setting circuit C1. The current output circuit 412 produces a current of a value that meets the voltage of a video signal that is input.

The current output from the current output circuit 412 is input to a reset circuit 417 possessed by the current-setting circuit C1. The reset circuit 417 possesses two transmission gates 413, 414 and an inverter 416.

A reset signal Res is input to the transmission gate 414, and a reset signal Res inverted through the inverter 416 is input to the transmission gate 413. The transmission gate 413 and the transmission gate 414 work in synchronism with the inverted reset signal and with the reset signal, respectively, and either one of them is turned off when the other one is turned on.

When the transmission gate 413 is turned on, the current is input to the corresponding signal line. When the transmission gate 414 is on, on the other hand, the voltage of the power source 415 is given to the corresponding signal line.

Figure 11:
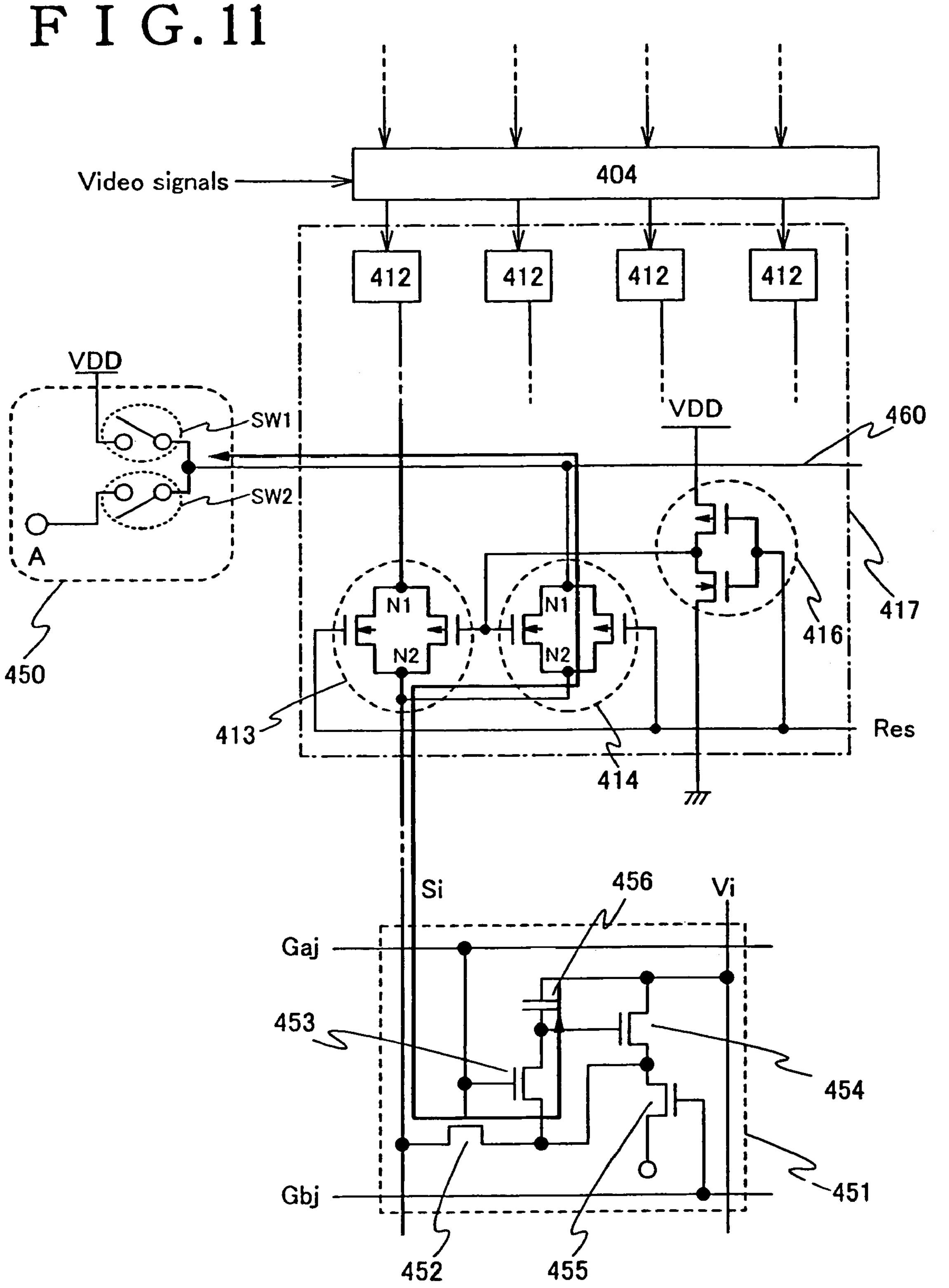
FIG. 11 is a view illustrating a relationship of connection between an element substrate and measuring means.
Figure 12A:
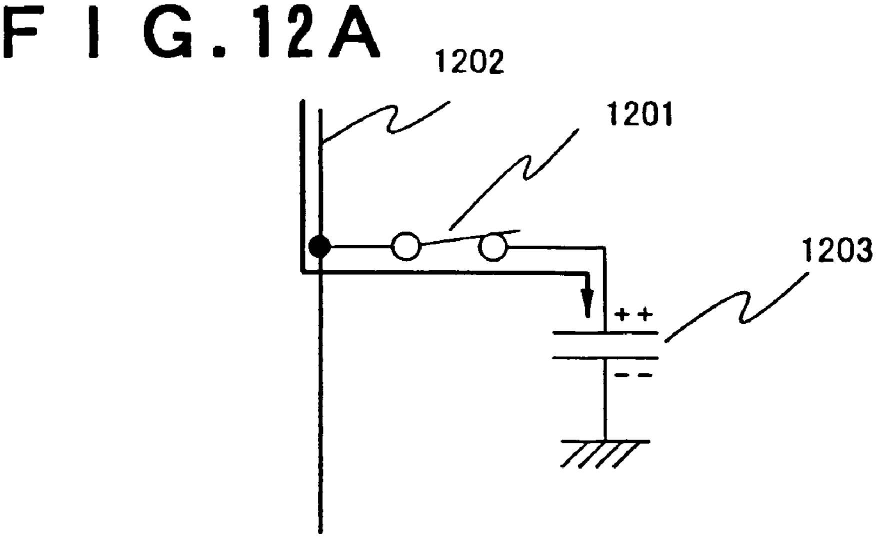
FIGS. 12A-C are views illustrating the principle of the inspection method.
Figure 12B:
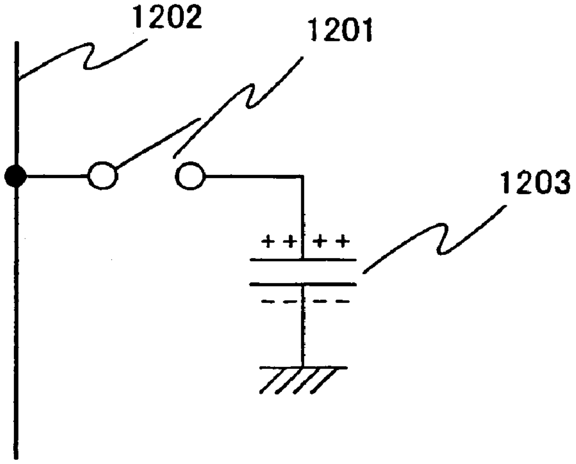
Figure 12C:
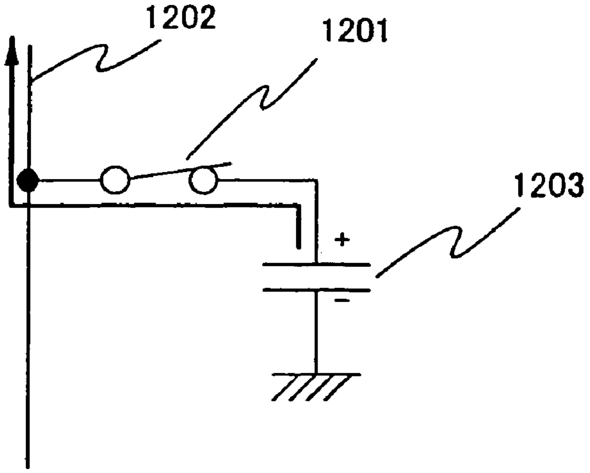
Figure 13A:
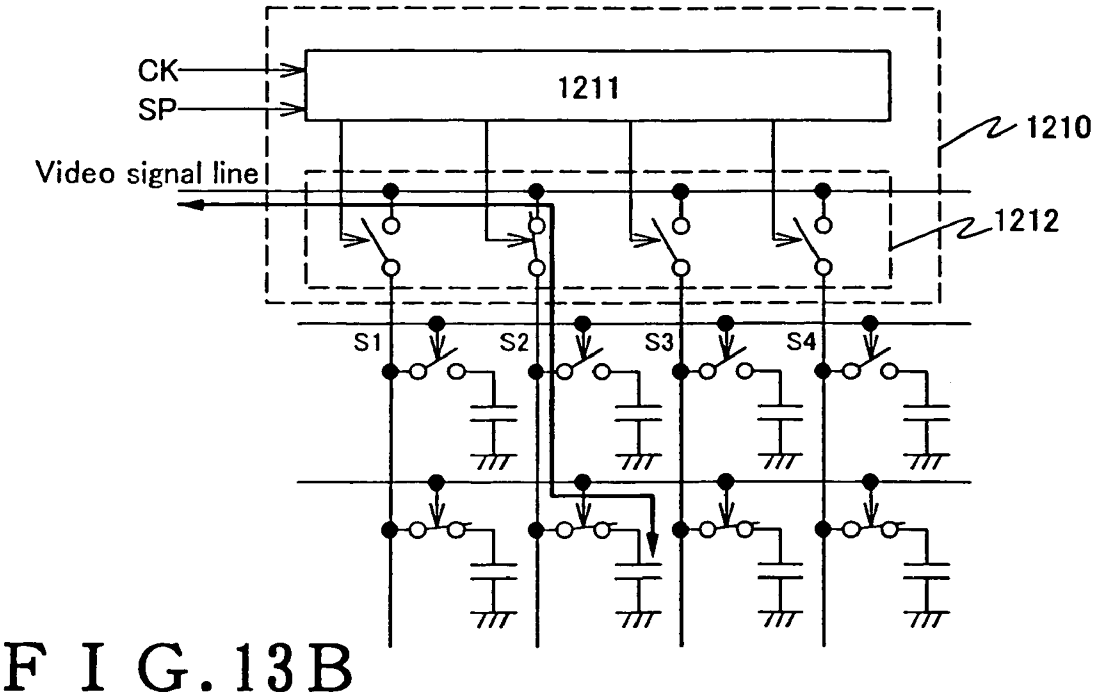
FIG.13A PRIOR ART
FIG. 13A is a view illustrating a conventional inspection method and FIG. 13B is a view illustrating an inspection method.
Figure 13B:
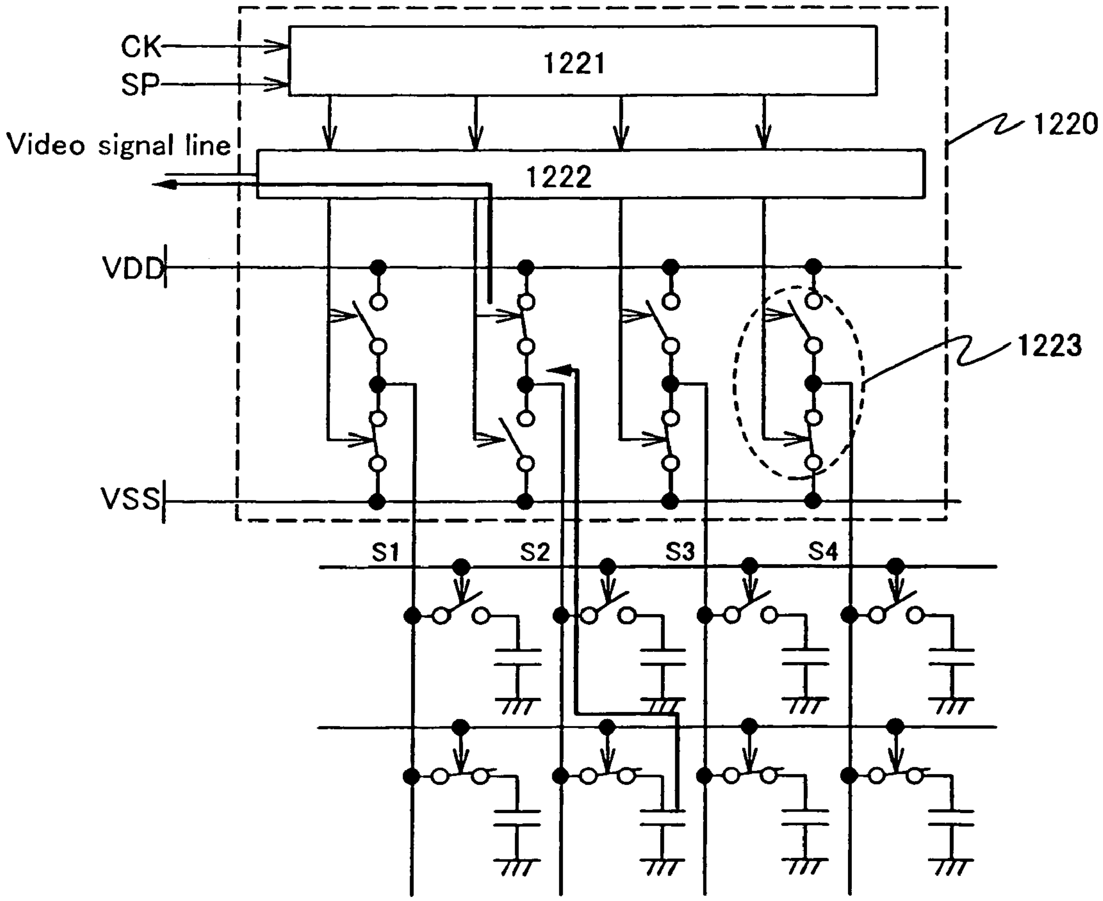
Figure 14:
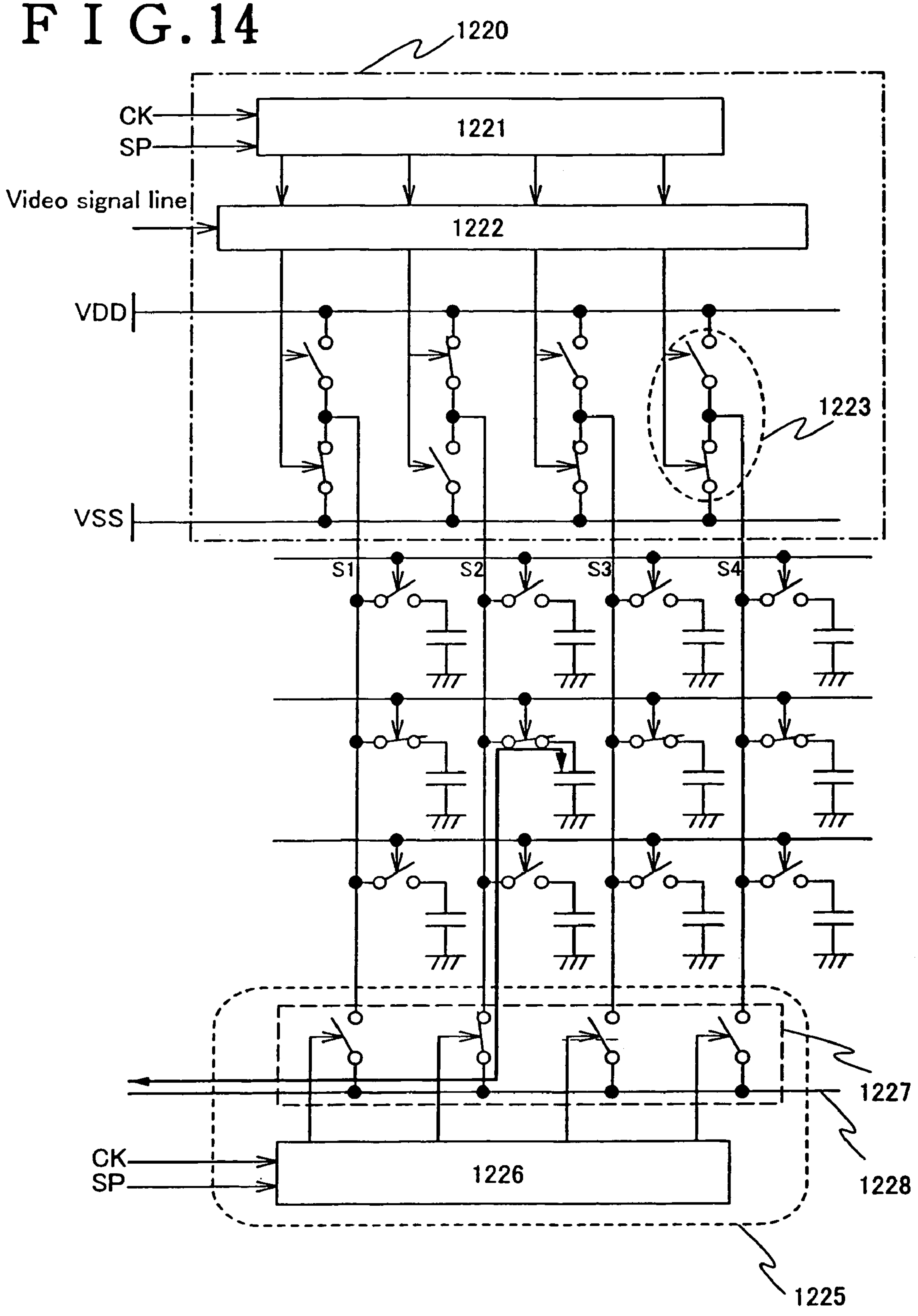
FIG. 14 is a view illustrating another inspection method.

FIG. 11 illustrates the constitutions of the element substrate to be inspected and of the measuring means. The portions illustrated already in FIG. 10A and FIG. 10B are denoted by the same reference numerals. A pixel 451 possessed by the element substrate illustrated in FIG. 11 includes two TFTs 452, 453 that work as a switching element, a TFT 454 that convert a current fed to a signal line into a voltage and converts the voltage into a current after the switching element is turned off, a TFT 455 that controls the supply of a drain current from the TFT 454 to the light-emitting element, and a holding capacitor 456.

Concretely, the TFT 452 and TFT 453 are connected at their gates to the canning line Gj. Either the source or the drain of the TFT 452 is connected to the signal line Si, and the other one is connected to the drain of the TFT 454. Either the source or the drain of the TFT 453 is connected to the drain of the TFT 454 and the other one is connected to the gate of the TFT 454. The source of the TFT 454 is connected to the current feeder line Vi, and either the source or the drain of the TFT 455 is connected to the drain of the TFT 454.

Further, either one of the two electrodes possessed by the holder capacitor 456 is connected to the gate of the TFT 454 and the other one is connected to the current feeder line Vi.

The transmission gates 413 and 414 have an n-channel TFT and a p-channel TFT, respectively, and the two TFTs are connected together at their source and drain. The n-channel TFT possessed by the transmission gate 413 and the p-channel TFT possessed by the transmission gate 414 are connected together at their gates, and the p-channel TFT possessed by the transmission gate 413 and the n-channel TFT possessed by the transmission gate 414 are connected together at their gates.

In the transmission gates 413 and 414, further, the nodes to where are connected the sources of the p-channel TFTs and the drains of the n-channel TFTs are denoted by N1, and the nodes to where are connected the drains of the p-channel TFTs and the sources of the n-channel TFTs are denoted by N2. In this case, the nodes N2 of the transmission gates 413 and 414 are both connected to the signal line Si, and the node N1 of the transmission gate 413 is connected to the output side of the current output circuit 412. Further, the node N1 of the transmission gate 414 is connected to the power source line 460.

The power source line 460 is connected to the measuring means 450 via connection terminals provided on the element substrate. The measuring means 450 includes the first switch SW1 for controlling the supply of power source voltage VDD to the connection terminal and the second switch SW2 for controlling the connection of the connection terminal to the measuring point A at where the amount of electric charge is measured. The supply of power source voltage VDD to the measuring point A is controlled by SW1 and SW2.

Next, described are the operations of the element substrate and of the measuring means at the time of inspection. As described above, the inspection method of the present invention can be described being divided into four steps of accumulating the electric charge in the holding capacitor of the pixel, holding the electric charge, precharging the measuring point with a voltage and reading the electric charge.

At the first step, the transmission gate 413 that works as a connection control circuit is turned off and the transmission gate 414 is turned on by a reset signal Res. Then, SW1 is turned on to supply the power source voltage VDD which is the inspection signal to the signal line Si via the power source line 460. Further, TFTs 452 and 453 are turned on so that an electric charge is accumulated in the holding capacitor 456 due to the power source voltage VDD.

At the second step, TFTs 452 and 453 are turned off enabling the electric charge to be held by the holding capacitor 456.

At the third step, next, SW1 is turned on, SW2 is turned on, the transmission gate 413 is turned off, the transmission gate 414 is turned on by the reset signal Res and, in this state, the signal line Si is connected to the power source line 460. Owing to the above constitution, the power source voltage VDD is supplied to a passage from the measuring point A to the signal line Si, and the measuring point is placed in a precharged state.

Next, at the fourth step, SW1 is turned off and SW2 is turned on. Then, TFTs 452 and 453 are turned on to measure the voltage, current or waveform thereof at the measuring point A to thereby read the electric charges accumulated in the holding capacitors in the pixels and, hence, to make sure if the signal is normally input to the pixels and if the electric charge is normally held by the holding capacitors 456.

In the case of FIG. 11, the inspection signal assumes the voltage VDD and the measuring point A, too, is assuming the voltage VDD just before being read out. Therefore, when the signal is normally input to the pixel and when the electric charge is normally held by the holding capacitor, the voltage, current or waveform thereof at the measuring point A will not fluctuate or will fluctuate to a negligible degree at the time of reading the electric charge provided the signal is normally input to the pixel and the electric charge is normally held by the holding capacitor. Conversely, when the voltage, current or waveform thereof at the measuring point A fluctuates to a degree in excess of a range that is regarded normal at the time of reading the electric charge, it can be judged that the signal has not been normally input to the pixel or the electric charge has not been normally held by the holding capacitor.

Upon simultaneously executing the operation of the second step and the operation of the third step, further, it is allowed to quicken the inspection.

Owing to the above constitution of the present invention, there is no need of using the video signal line as a passage for reading the electric charge. It is therefore possible to read the electric charge even when the video signal line cannot be connected to the signal line in the signal line drive circuit.

Further, there is no need of providing an inspection-dedicated circuit avoiding the hindrance against realizing the semiconductor display devices in small sizes, and preventing the number of pieces of element substrates that can be obtained from a piece of large substrate from decreasing due to occupation of space by the inspection-dedicated circuit. It is further allowed to easily conduct the inspection without changing the constitution of the element substrate.

What is claimed is:

1. An element substrate comprising:

a pixel unit, a signal line drive circuit, and a scanning line drive circuit, wherein the pixel unit is provided with a signal line and a scanning line;

wherein a pixel is provided in the pixel unit;

wherein the signal line drive circuit comprises a latch to which a video signal is input and a connection control circuit connected to the latch electrically;

wherein the pixel comprises a switching element and a holding capacitor;

wherein the scanning line drive circuit is electrically connected to the switching element and the holding capacitor through a scanning line;

wherein the switching element and the holding capacitor are electrically connected to the connection control circuit and the connection control circuit through a signal line;

wherein the connection control circuit is electrically connected to a first connection terminal through a first wiring being a video signal line;

wherein the connection control circuit is electrically connected to a second connection terminal through a second wiring; and wherein the first wiring is electrically connected to the second wiring through the connection control circuit.

2. An element substrate according to claim 1, wherein the first connection terminal is electrically connected to measuring means; and wherein the second connection terminal is electrically connected to a power source.

3. An element substrate according to claim 2, wherein the measuring means comprises a first switch for controlling a supply of a power source voltage to the first connection terminal and a second switch for controlling a connection between the first connection terminal and a measuring point where an amount of electric charge is measured.

4. An element substrate according to claim 1, wherein the first connection terminal is electrically connected to a power source; and wherein the second connection terminal is electrically connected to measuring means.

5. An element substrate according to claim 4, wherein the measuring means comprises a first switch for controlling a supply of a power source voltage to the second connection terminal and a second switch for controlling a connection between the second connection terminal and a measuring point where an amount of electric charge is measured.

6. An element substrate comprising:

a pixel unit, a signal line drive circuit, and a scanning line drive circuit, wherein the pixel unit is provided with a signal line and a scanning line;

wherein a pixel is provided in the pixel unit;

wherein the signal line drive circuit comprises a latch to which a video signal is input and an inverter connected to the latch electrically;

wherein the pixel comprises a switching element and a holding capacitor, wherein the scanning line drive circuit is electrically connected to the switching element and the holding capacitor through a scanning line;

wherein the switching element and the holding capacitor are electrically connected to the connection control circuit and the connection control circuit through a signal line;

wherein the inverter is electrically connected to a first connection terminal through a first wiring being a video signal line;

wherein the inverter is electrically connected to a second connection terminal through a second wiring; and wherein the first wiring is electrically connected to the second wiring through the inverter.

7. An element substrate according to claim 6, wherein the first connection terminal is electrically connected to measuring means; and wherein the second connection terminal is electrically connected to a power source.

8. An element substrate according to claim 7, wherein the measuring means comprises a first switch for controlling a supply of a power source voltage to the first connection terminal and a second switch for controlling a connection between the first connection terminal and a measuring point where an amount of electric charge is measured.

9. An element substrate according to claim 7, wherein the measuring means comprises a first switch for controlling a supply of a power source voltage to the second connection terminal and a second switch for controlling a connection between the second connection terminal and a measuring point where an amount of electric charge is measured.

10. An element substrate according to claim 6, wherein the first connection terminal is electrically connected to a power source; and wherein the second connection terminal is electrically connected to measuring means.

11. An element substrate comprising:

a signal line drive circuit comprising a sampling circuit and a reset circuit connected to the sampling circuit, and a pixel unit comprising a pixel, wherein the reset circuit is electrically connected to the pixel, wherein the reset circuit comprises a first transmission gate and a second transmission gate, and an inverter; and wherein measuring means is electrically connected to the pixel though the first transmission gate.

12. An element substrate according to claim 11, wherein the first transmission gate is electrically connected to the measuring means through a power source line; and wherein the first transmission gate is electrically connected to the pixel through a signal line.

13. An element substrate according to claim 11, wherein each of the a first transmission gate and the second transmission gate has an n-channel TFT and a p-channel TFT.

* * * * *